(12) United States Patent
Huang et al.

(10) Patent No.: US 11,764,143 B2
(45) Date of Patent: Sep. 19, 2023

(54) INCREASING CONTACT AREAS OF CONTACTS FOR MIM CAPACITORS

(71) Applicant: Taiwan Semiconductor Manufacturing Co., Ltd., Hsinchu (TW)

(72) Inventors: Yao-Te Huang, Hsinchu (TW); Yung-Shih Cheng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/900,289

(22) Filed: Jun. 12, 2020

(65) Prior Publication Data
US 2021/0391248 A1    Dec. 16, 2021

(51) Int. Cl.
| | |
|---|---|
| *H01L 23/522* | (2006.01) |
| *H01L 23/64* | (2006.01) |
| *H01L 21/768* | (2006.01) |
| *H01L 21/308* | (2006.01) |
| *H01L 49/02* | (2006.01) |

(52) U.S. Cl.
CPC ........ *H01L 23/5222* (2013.01); *H01L 21/308* (2013.01); *H01L 21/76897* (2013.01); *H01L 23/642* (2013.01); *H01L 28/60* (2013.01)

(58) Field of Classification Search
CPC .......... H01L 28/92; H01L 28/88; H01L 28/87; H01L 28/60; H01L 28/40; H01L 23/5222; H01L 23/5223; H01L 23/642; H01L 27/10852; H01L 27/10855; H01L 21/76897; H01L 21/3083; H01L 21/3081; H01L 21/308
See application file for complete search history.

(56) References Cited

U.S. PATENT DOCUMENTS

2020/0350248 A1* 11/2020 Park ........................ H01L 28/60

\* cited by examiner

*Primary Examiner* — Thanhha S Pham
(74) *Attorney, Agent, or Firm* — Slater Matsil, LLP

(57) ABSTRACT

A method includes forming a first electrode layer having a first opening, with the first opening having a first lateral dimension, forming a first capacitor insulator over the first electrode layer, and forming a second electrode layer over the first capacitor insulator, with the second electrode layer having a second opening. The first opening is directly underlying the second opening. The second opening has a second lateral dimension greater than the first lateral dimension. The method further includes depositing a dielectric layer over the second electrode layer, and forming a contact opening, which comprises a first portion including the first opening, and a second portion including the second opening. A conductive plug is formed in the contact opening.

18 Claims, 19 Drawing Sheets

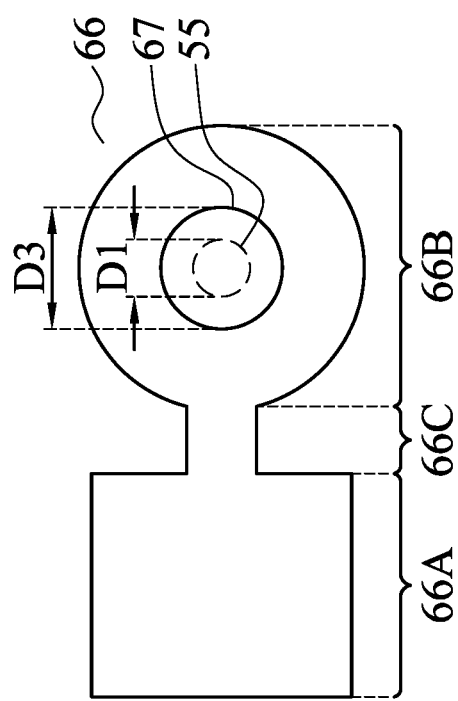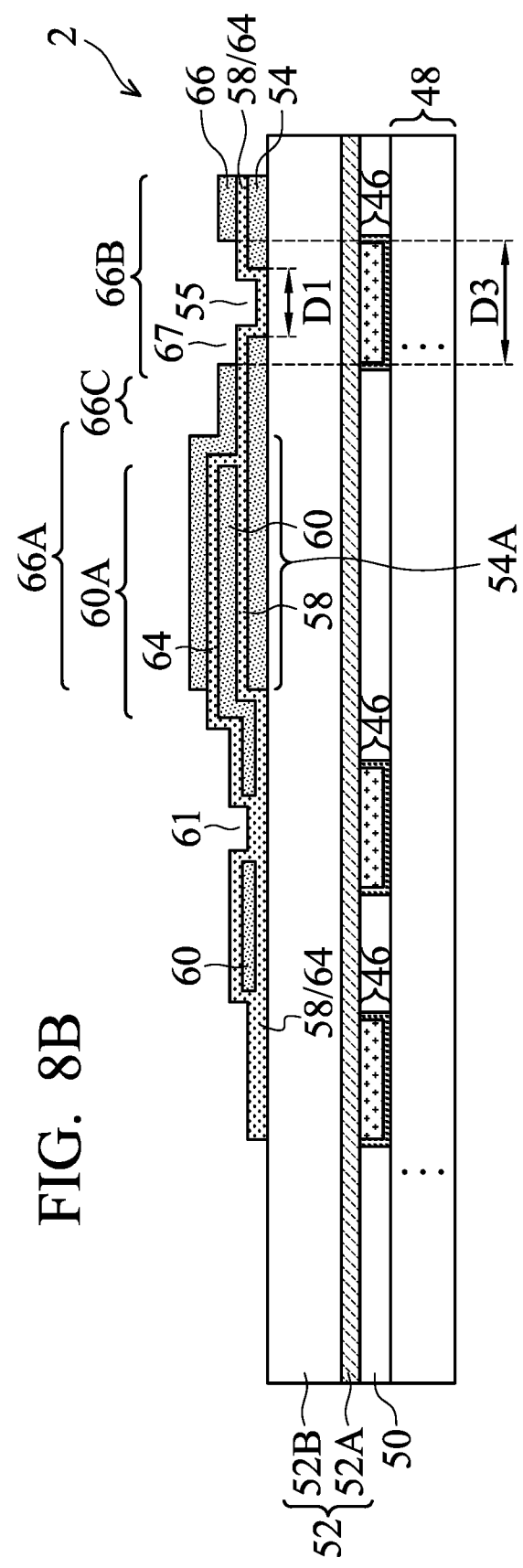
FIG. 8B
FIG. 8A

INCREASING CONTACT AREAS OF CONTACTS FOR MIM CAPACITORS

BACKGROUND

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, logic operation circuits, etc. The MIM capacitors have stacked layers of capacitor electrodes and insulators, with the insulators separating the overlying capacitor electrodes from the respective underlying capacitor electrodes.

Conventional MIM capacitors may have their capacitor electrodes connected to the features such as metal pads through vias. The vias are electrically connected to the metal pads through side contacts, wherein the vias have their edges contacting the edges of the metal pads, which metal pads are electrically connected to the capacitor electrodes. Since the metal pads are typically very thin, the contact area is small, and the contact resistance is high.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A, 4B, 5, 6A, 6B, 7, 8A, 8B, and 9-16 illustrate cross-sectional views and top views of intermediate stages in the formation of a Metal-Insulator-Metal (MIM) capacitor in a wafer in accordance with some embodiments.

DETAILED DESCRIPTION

Figure 1:
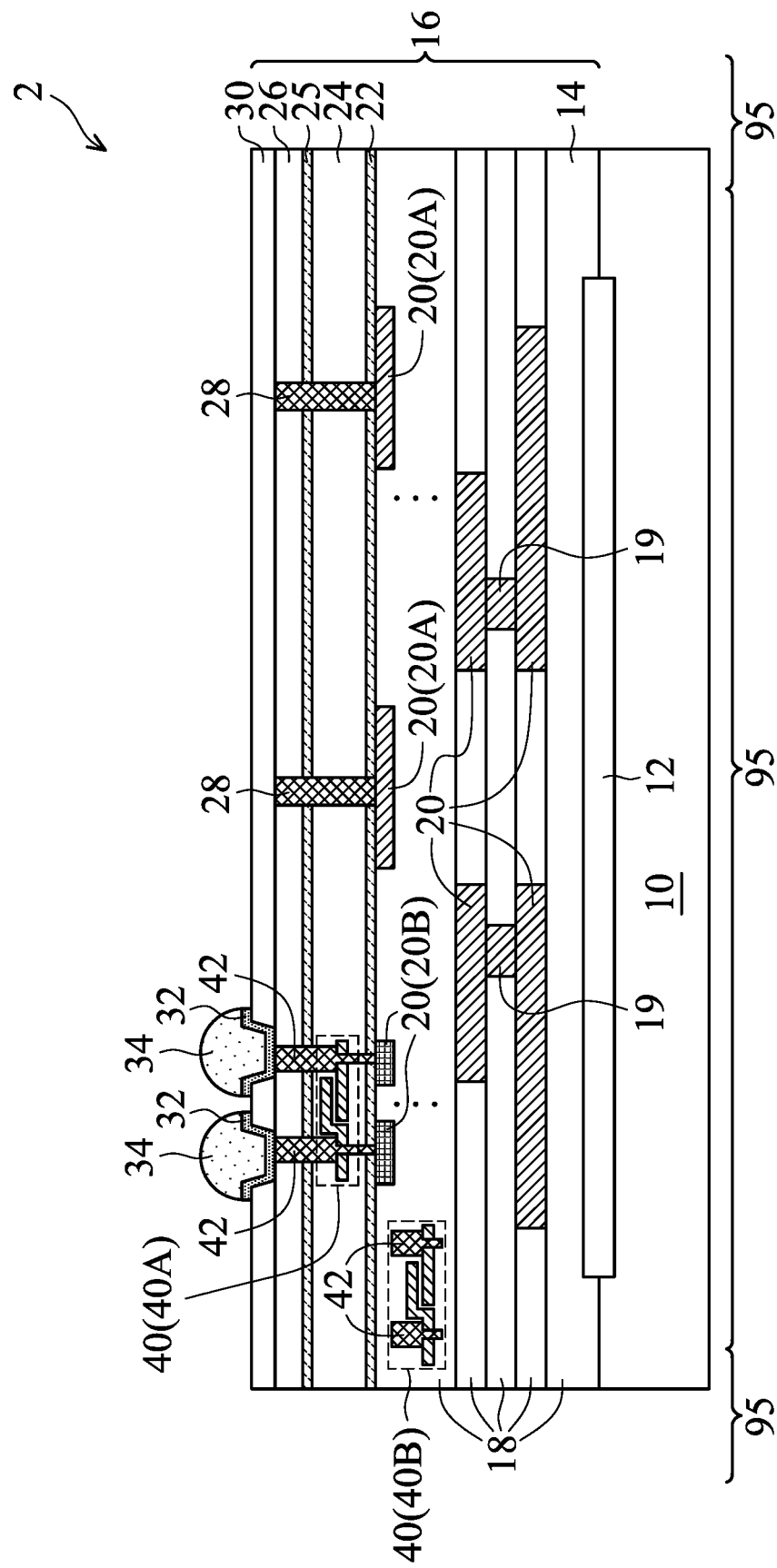
FIG. 1 illustrates a cross-sectional view of a device die including a capacitor(s) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device die and the corresponding wafer including a Metal-Insulator-Metal (MIM) capacitor and the method of forming the same are provided in accordance with some embodiments. The intermediate stages of forming the capacitor are illustrated. Conductive plugs are formed to penetrate through the metal pads that are connected to the capacitor electrodes of the MIM capacitor. To reduce the contact resistance between the vias and the metal pads, the conductive plugs, besides contacting the metal pads through edge contacts, also contact the top surfaces of the metal pads. Accordingly, the contact resistance is reduced. The variations of the embodiments are discussed. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Referring to FIG. 1, wafer 2, which includes semiconductor substrate 10, is provided. Wafer 2 may include a plurality of identical device dies 95. In accordance with some embodiments of the present disclosure, semiconductor substrate 10 is a bulk silicon substrate or a silicon-on-insulator substrate. In accordance with alternative embodiments of the present disclosure, other semiconductor materials that include group III, group IV, and/or group V elements may also be used, which may include silicon germanium, silicon carbon, and/or III-V compound semiconductor materials. Integrated circuit devices such as transistors (schematically illustrated as 12) are formed at a surface of semiconductor substrate 10. Wafer 2 may further include Inter-Layer Dielectric (ILD) 14 and interconnect structure 16 over semiconductor substrate 10. Interconnect structure 16 includes metal lines 20 and vias 19, which are formed in dielectric layers 18. The metal lines at a same level are collectively referred to as being a metal layer hereinafter. Accordingly, interconnect structure 16 may include a plurality of metal layers that are interconnected through vias 19. Metal lines 20 and vias 19 may be formed of or comprise copper or copper alloys, although they can also be formed of other conductive materials. In accordance with some embodiments of the present disclosure, dielectric layers 18 are formed of low-k dielectric materials. The dielectric constants (k values) of the low-k dielectric materials may be lower than about 3.0, for example.

Interconnect structure 16 may include a top metal layer. The dielectric layer 18, in which the top metal layer is located, may be a topmost layer of the low-k dielectric layers. In accordance with some embodiments, the top metal layer includes metal pads/lines 20A and 20B. In accordance with some embodiments, metal pads/lines 20A are connected to the underlying devices 12. Metal pads/lines 20B may be electrically connected to, or maybe electrically disconnected from, the underlying devices 12. In addition, metal pads/lines 20B are used for the subsequently formed conductive plugs to land thereon, wherein the conductive plugs are connected to the MIM capacitor formed in subsequent processes.

Over the top metal layer may reside dielectric layer 22. In accordance with some embodiments of the present disclosure, dielectric layer 22 is formed of or comprises a non-low-k dielectric material having a k value equal to 3.8 or higher. For example, dielectric layer 22 may be formed silicon nitride. Alternatively, dielectric layer 22 may include a silicon oxide layer and a silicon nitride layer over the silicon oxide layer. Dielectric layer 22 is sometimes referred to as a first passivation layer or pass-1. Over dielectric layer 22 resides dielectric layer 24. Dielectric layer 24 may represent a plurality of dielectric layers, as will be discussed referring to FIGS. 2 through 16. In accordance with some embodiments, dielectric layer 24 may be formed of or comprise Undoped Silicate Glass (USG), silicon oxide, or the like.

In accordance with some embodiments, etch stop layer 25 is formed, which may be formed of or comprise silicon nitride, silicon carbide, silicon oxynitride, or the like. Dielectric layer 26, which may include one dielectric layer or a plurality of dielectric layers, may further be formed over etch stop layer 25. Dielectric layer 26 may also be formed of USG, silicon oxide, or the like. Passivation layer 30 may be formed over dielectric layer 26. Under-Bump Metallurgy (UBM) 32 may be formed to penetrate through passivation layer 30. Electrical connectors 34, which may be solder regions, metal pillars, or the like, may be formed on top of passivation layer 30.

In accordance with some embodiments of the present disclosure, capacitors 40 (represented by 40A and/or 40B) are formed in any of dielectric layers 18, dielectric layer 24, or the like. For example, capacitors 40 may be in the top dielectric layer 18 that is immediately underlying the passivation layer 22, and the corresponding capacitors are represented by capacitor 40B. Capacitors 40 may also be formed in a polymer layer (if formed) over passivation layer 22.

In accordance with some embodiments of the present disclosure, capacitors 40 are decoupling capacitors, with the top capacitor electrodes and the bottom capacitor electrodes of capacitors 40 being electrically coupling to power supply nodes such as VDD and VSS nodes, respectively. Accordingly, capacitors 40 are used to filter noise and/or used as a power-storage for reducing the voltage variation resulted from the current-drawing from the power source. In accordance with alternative embodiments of the present disclosure, the top capacitor electrodes and the bottom capacitor electrodes of capacitors 40 are connected to signal lines, and capacitors 40 are used to filter noise. In accordance with alternative embodiments, capacitors 40 are used for other purposes such as in Dynamic Random Access Memory (DRAM) cells. Contact plugs 42 are formed to electrically connect to capacitors 40. The details of contact plugs 42 are discussed in subsequent paragraphs.

It is appreciated that the structure shown in FIG. 1 is an example, and other structures are also in the scope of the present disclosure. For example, passivation layers and polymer layers may be formed over the top dielectric layer 18. Metal pads, which may be formed of or comprise aluminum copper, may be formed over the passivation layers, and the polymer layers may be formed over the passivation layers. Post-Passivation Interconnects (PPIs) may be formed, which include line portions over the corresponding polymer layers, and via portions extending into the corresponding polymer layers. The polymer layers may be formed of polybenzoxazole (PBO), polyimide, benzocyclobutene (BCB), or the like, and UBMs 32 may extend into a top polymer layer.

Figure 19:
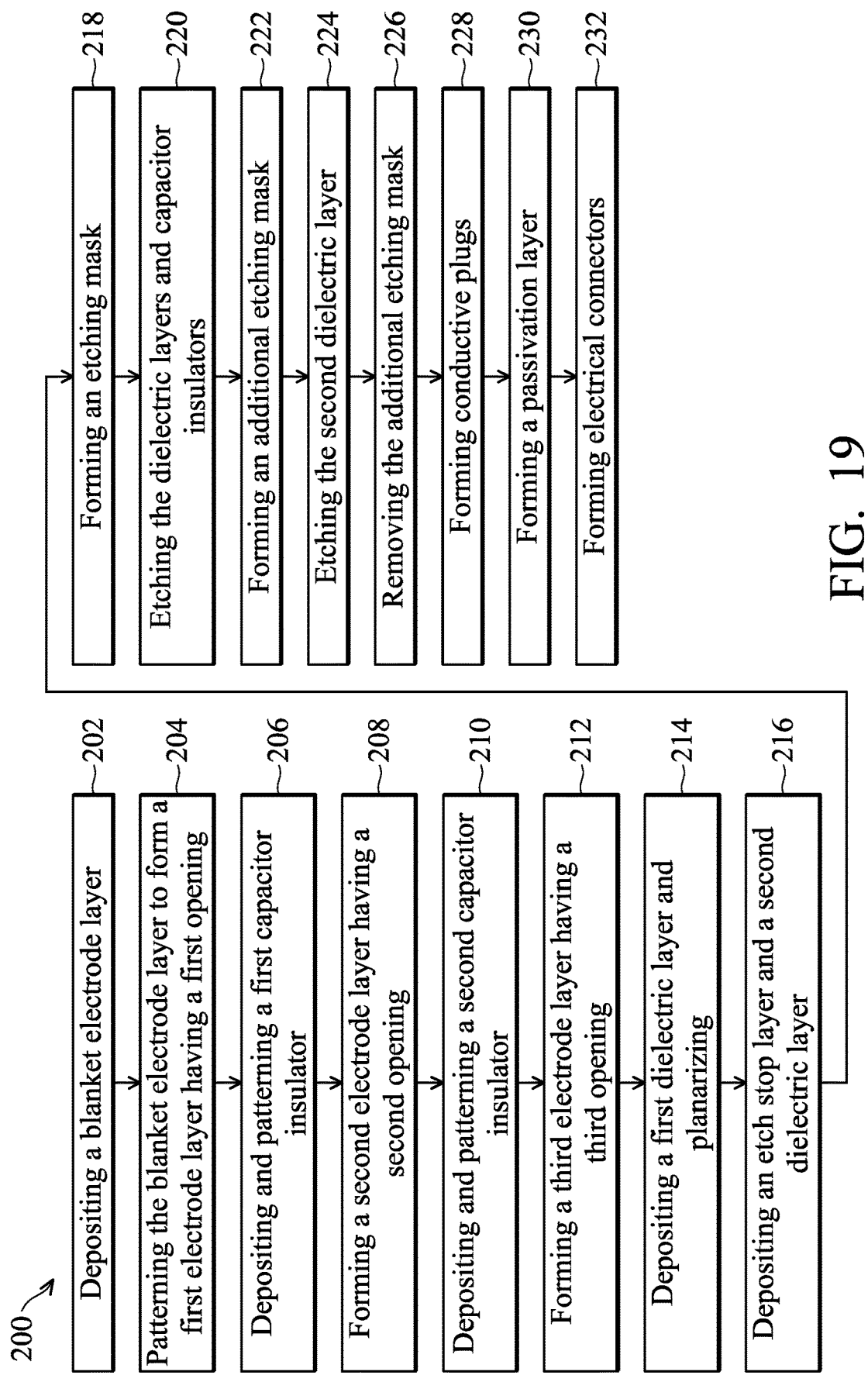
FIG. 19 illustrates a process flow for forming a MIM capacitor in accordance with some embodiments.

FIGS. 2 through 16 illustrate the cross-sectional views of intermediate stages in the formation of capacitor 40 in wafer 2 in accordance with some embodiments of the present disclosure. The processes as shown in FIG. 2 through 16 are also illustrated schematically in the process flow shown in FIG. 19. The processes shown in FIGS. 2 through 16 represents the processes for forming capacitor 40A in dielectric layer 24 as shown in FIG. 1. The concept of the example embodiments may be used for forming capacitors in other locations and levels, such as represented by capacitor 40B in FIG. 1.

Figure 2:
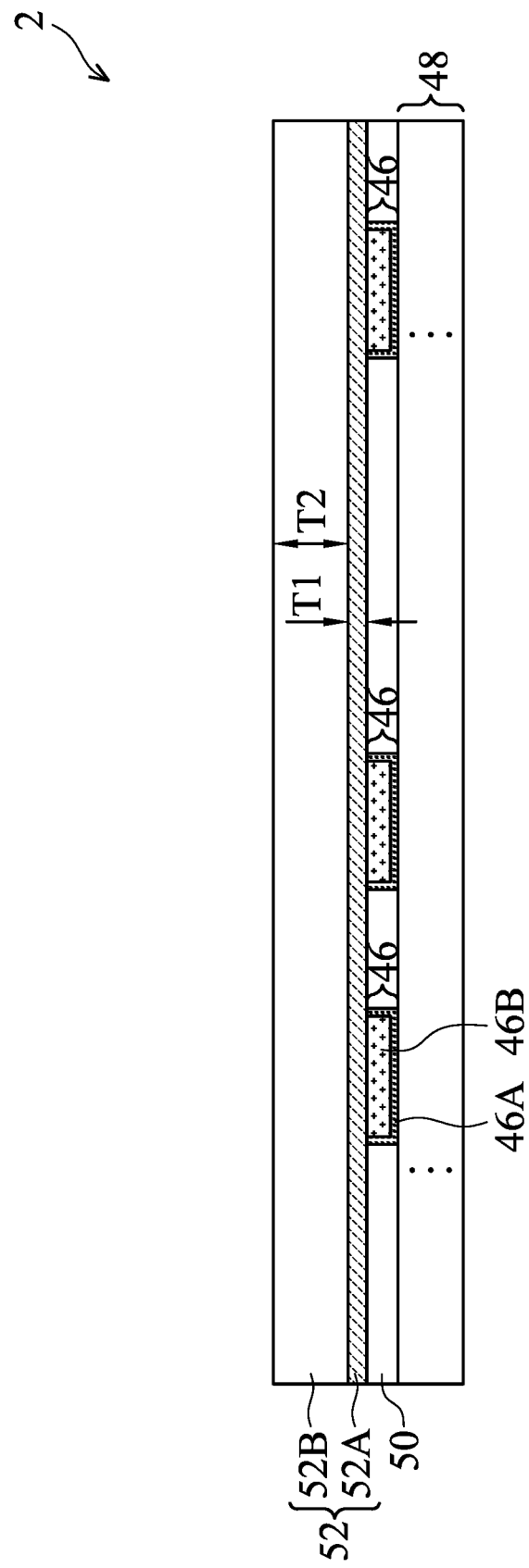

Referring to FIG. 2, wafer 2, conductive features 46 are illustrated, and the portions of wafer 2 underlying conductive features 46 are represented as structure 48. In accordance with some embodiments in which capacitor 40A (FIG. 1) is to be formed, conductive features 46 are the metal lines or metal pads 20B (FIG. 1). In accordance with some embodiments in which capacitor 40B (FIG. 1) is to be formed, conductive features 46 are the metal lines or metal pads underlying dielectric layer 22 (FIG. 1). In accordance with yet other embodiments in which capacitor 40 (FIG. 1) is to be formed in a polymer layer, conductive features 48 may be parts of the PPI. Conductive features 48 are formed in dielectric layer 50, which represents the top dielectric layer 18 if capacitor 40A in FIG. 1 is to be formed, or may represent another dielectric layer if capacitor 40 is to be formed in other positions.

In accordance with some embodiments, conductive features 46 have a damascene structure, and may include a barrier layers 46A and metal regions 46B. In accordance with some embodiments, barrier layers 46A are formed of or comprise titanium, titanium nitride, tantalum, tantalum nitride, or the like. Metal regions 46B may be formed of or comprise copper, a copper alloy, or the like.

Dielectric layers 52 are formed over conductive features 46. Dielectric layers 52 may include dielectric layer 52A and dielectric layer 52B over dielectric layer 52A. Dielectric layers 52A and 52B are formed of different materials, which may be inorganic materials in accordance with some embodiments. For example, dielectric layer 52A may be formed of silicon nitride, silicon carbide, silicon oxynitride or the like. Dielectric layer 52A may be used as an etch stop layer in accordance with some embodiments. The Thickness T1 of dielectric layer 52A may be in the range between about 500 Å and about 1,000 Å. Dielectric layer 52B may be formed of USG, silicon oxide, or the like. The thickness T2 of dielectric layer 52B may be in the range between about 2 kÅ and about 6 kÅ. Dielectric layers 52A and 52B may be formed using Plasma Enhance Chemical Vapor Deposition (PECVD), Low-Pressure Chemical Vapor Deposition (LPCVD), Atomic Layer Deposition (ALD), or the like.

Figure 3:
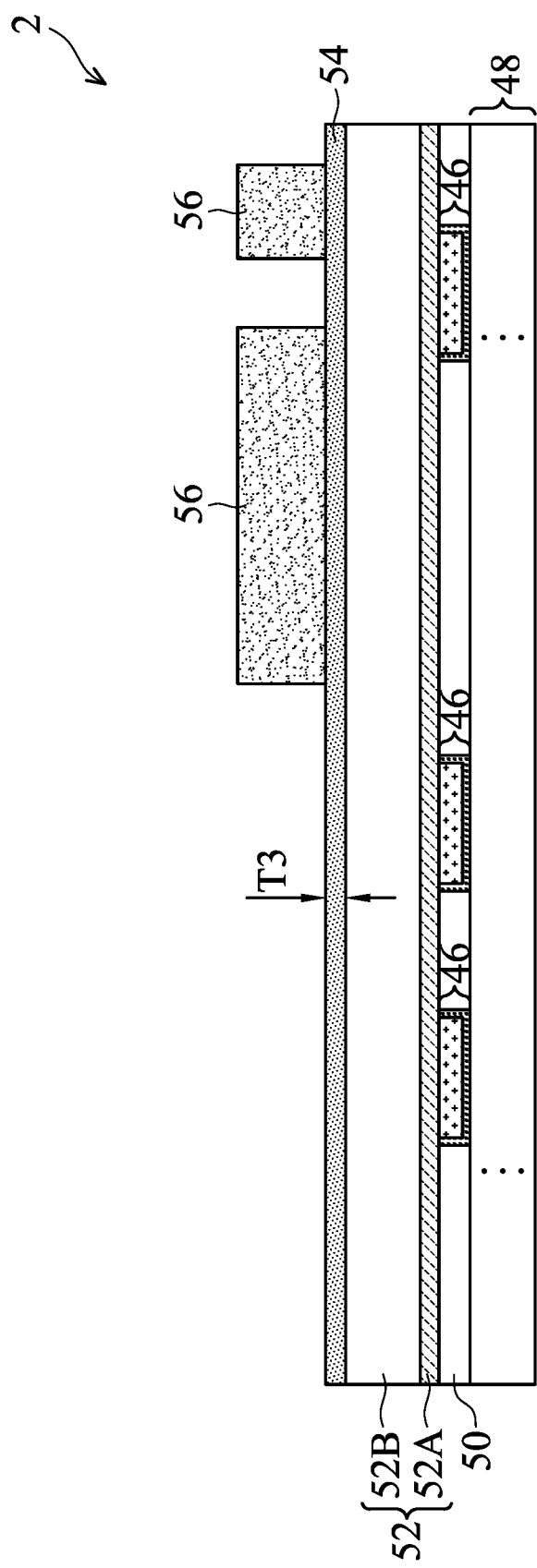

Next, referring to FIG. 3, blanket electrode layer 54 is deposited. The respective process is illustrated as process 202 in the process flow 200 shown in FIG. 19. In accordance with some embodiments of the present disclosure, electrode layer 54 is formed of or comprises a conductive material, which may be a metal nitride such as titanium nitride (TiN). The thickness T3 of electrode layer 54 may be in the range between about 200 Å and about 600 Å. Blanket electrode layer 54 may also be formed of or comprise other conductive materials such as tantalum nitride, titanium, copper, aluminum, or the like, or multi-layers thereof. Etching mask 56 is formed over blanket electrode layer 54, and is patterned. Etching mask 56 may be formed of photo resist, for example.

Figure 4B:
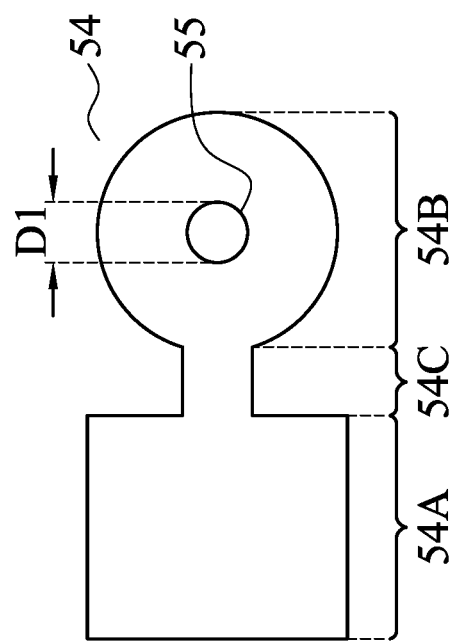
Figure 4A:
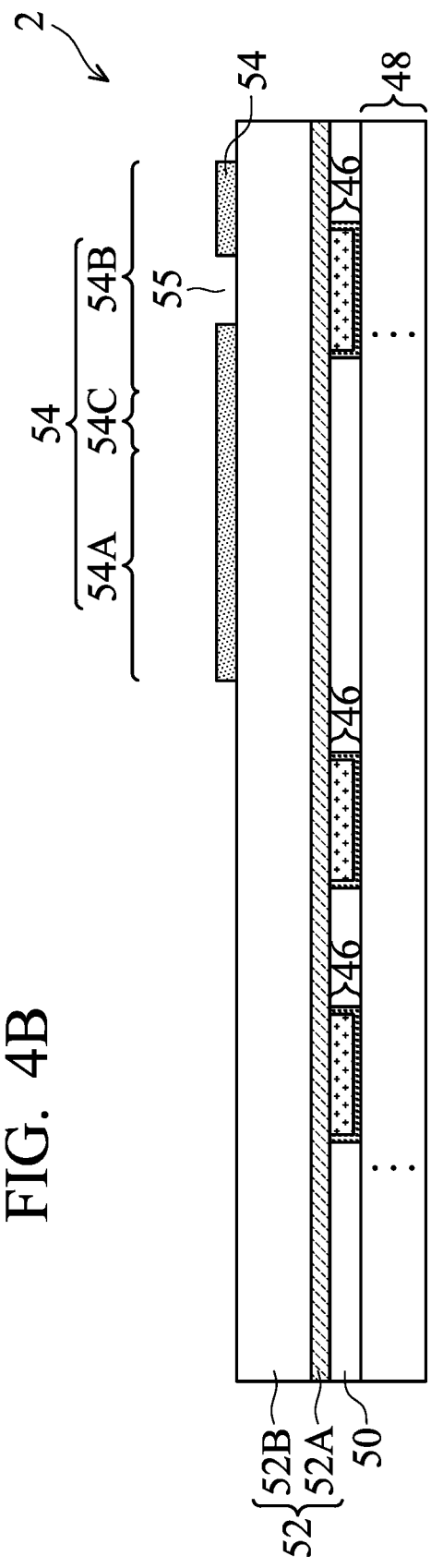

Next, blanket electrode layer 54 is etched using etching mask 56 to define its pattern, and the resulting electrode layer 54 is shown in FIG. 4A. The respective process is illustrated as process 204 in the process flow 200 shown in FIG. 19. In accordance with some embodiments, the etching process is performed using $BCl_3$, $Cl_2$, the mixture of $BCl_3$ and $Cl_2$, or the like. Other gases such as $O_2$ and Ar may be added, and plasma may be turned on in the etching process. After the etching process, etching mask 56 is removed.

FIG. 4B illustrates a plane view of the electrode layer 54 after the etching process. The resulting electrode layer 54 may include capacitor electrode 54A, and metal pad 54B electrically connecting to capacitor electrode 54A. There may be a narrower trace portion 54C connecting capacitor electrode 54A to metal pad 54B. Alternatively, capacitor electrode 54A is connected to metal pad 54B without the trace portion. Opening 55 is formed in metal pad 54B, and is encircled by metal pad 54B. In accordance with some embodiments, opening 55 has a circular shape. The lateral dimension D1, which may be a diameter, may be in the range between about 1 µm and about 1.5 µm in accordance with some embodiments. It is appreciated that although capacitor electrode 54A is shown as having a rectangular plane-view shape, and metal pad 54B and opening 55 are illustrated as having circular plane-view shapes, other shapes such as circles, rectangles, hexagons, octagons, or the like, may be adopted.

Figure 5:
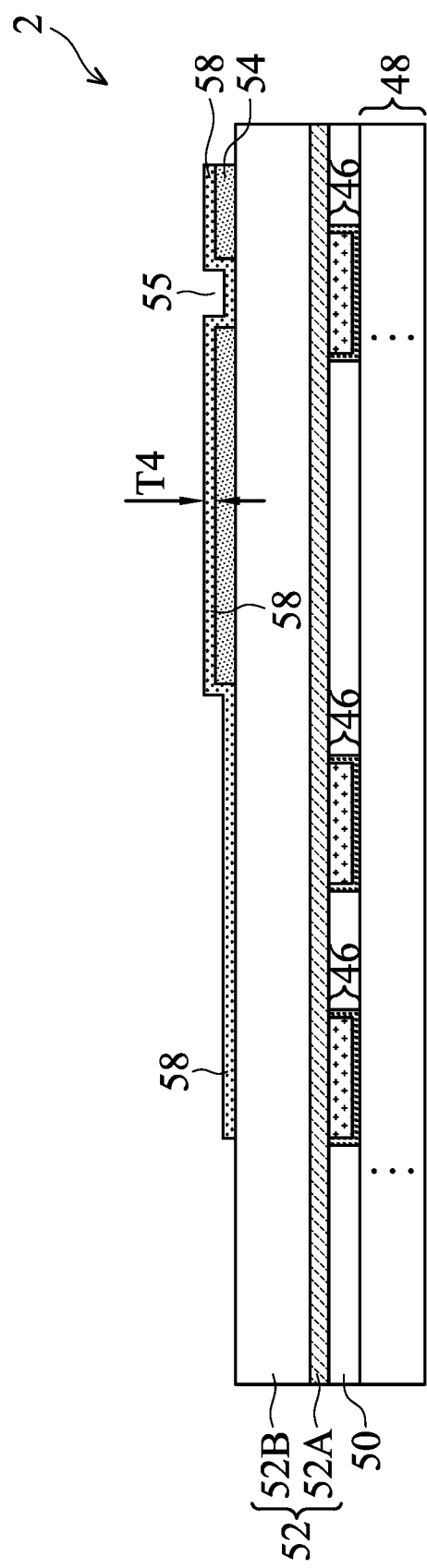

FIG. 5 illustrates the deposition and the patterning of capacitor insulator 58. The respective process is illustrated as process 206 in the process flow 200 shown in FIG. 19. The formation process may include a deposition process to form a blanket capacitor insulator layer, forming a patterned etching mask, and then etching the blanket capacitor insulator layer to form the capacitor insulator 58. In accordance with some embodiments of the present disclosure, capacitor insulator 58 is a single layer formed of a homogenous dielectric material such as zirconium oxide ($ZrO_2$). In accordance with other embodiments of the present disclosure, capacitor insulator 58 is a composite layer formed of stacked dielectric layers. For example, capacitor insulator 58 may be formed of $ZrO_2/Al_2O_3/ZrO_2$ (ZAZ), which includes a first $ZrO_2$ layer, an $Al_2O_3$ layer over the first $ZrO_2$ layer, and a second $ZrO_2$ layer over the $Al_2O_3$ layer. ZAZ advantageously has a low equivalent oxide thickness, and hence the capacitance value of the resulting capacitor is high. The thickness T4 of capacitor insulator 58 may be in the range between about 40 Å and about 80 Å. The patterning of capacitor insulator 58 may be performed using either dry etching or wet etching. The patterned capacitor insulator 58 may fully cover electrode layer 54, and may extend beyond the edges of electrode layer 54. Furthermore, capacitor insulator 58 extends into and partially fills opening 55.

Figure 6B:
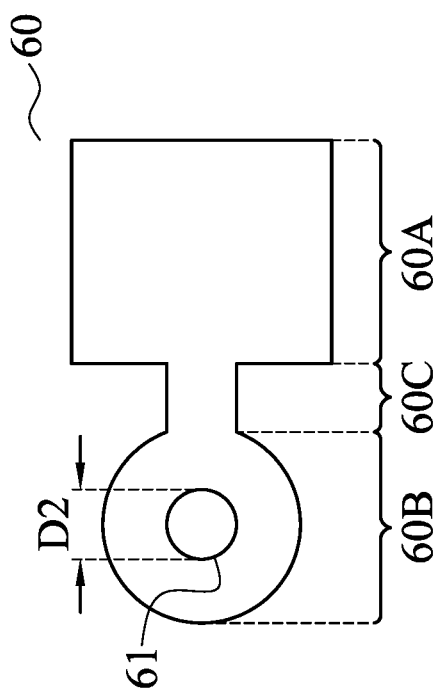
Figure 6A:
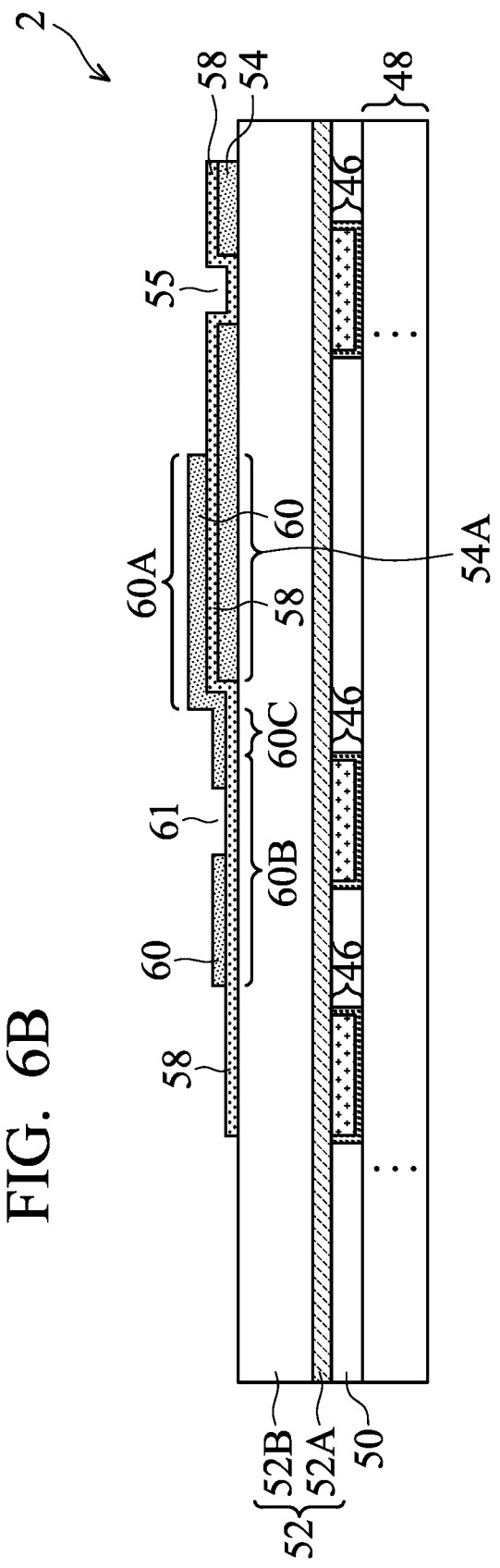

FIG. 6A illustrates the formation of electrode layer 60. The respective process is illustrated as process 208 in the process flow 200 shown in FIG. 19. In accordance with some embodiments, electrode layer 60 is formed of or comprises a conductive material selected from the same group of candidate materials as electrode layer 54. For example, electrode layer 60 may be formed of titanium nitride in accordance with some embodiments. The thickness of electrode layer 60 may be in the range between about 200 Å and about 600 Å. The formation process of electrode layer 60 may be similar to the processes shown in FIGS. 3 and 4A, which may include depositing a blanket electrode layer, forming a patterned etching mask, and etching the blanket electrode layer using the patterned etching mask to define pattern.

FIG. 6B illustrates a plane view of the electrode layer 60 after the etching. The resulting electrode layer 60 may include capacitor electrode 60A, and metal pad 60B electrically connecting to capacitor electrode 60A. There may be, or may not be, a narrower trace portion 60C connecting capacitor electrode 60A to metal pad 60B. Alternatively, capacitor electrode 60A is connected to metal pad 60B without the trace portion. Opening 61 is formed in metal pad 60B, and is encircled by metal pad 60B. Capacitor insulator 58 is exposed through opening 61. In accordance with some embodiments, opening 61 has a circular plane-view shape. The lateral dimension D2, which may be a diameter, may be in the range between about 1.0 µm and about 1.5 µm in accordance with some embodiments. It is appreciated that although electrode layer 60 is shown as having a rectangular plane-view shape, and metal pad 60B and opening 61 are illustrated as having circular plane-view shapes, other shapes such as circles, rectangles, hexagons, octagons, or the like, may be adopted. Capacitor electrode 60A overlaps capacitor electrode 54A. Furthermore, an entirety of capacitor electrode 60A is on capacitor insulator 58 in accordance with some embodiments.

Figure 7:
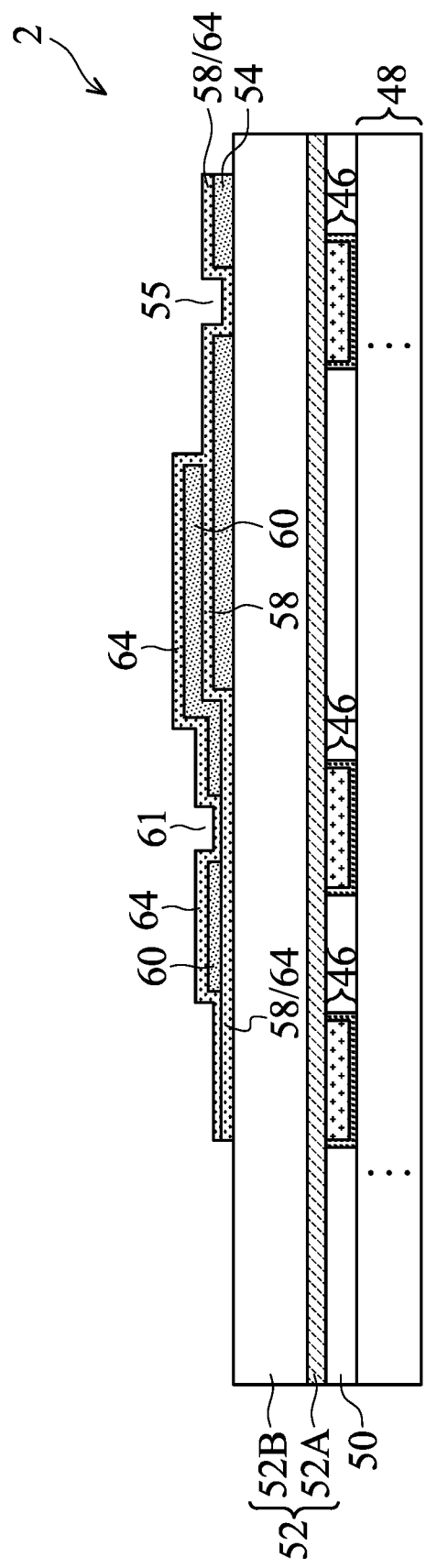

FIG. 7 illustrates the deposition and the patterning of capacitor insulator 64. The respective process is illustrated as process 210 in the process flow 200 shown in FIG. 19. The formation process may include a deposition process to form a blanket capacitor insulator layer, forming a patterned etching mask, and then etching the blanket capacitor insulator layer to form the capacitor insulator 64. In accordance with some embodiments of the present disclosure, capacitor insulator 64 is a single layer formed of a homogenous dielectric material such as $ZrO_2$. In accordance with other embodiments of the present disclosure, capacitor insulator 64 is a composite layer formed of stacked dielectric layers. For example, capacitor insulator 64 may be formed of ZAZ. The thickness of capacitor insulator 64 may be in the range between about 40 Å and about 80 Å. The patterning of capacitor insulator 64 may be performed using either dry etching or wet etching. The patterned capacitor insulator 64 may fully cover electrode layer 60, and may extend beyond the edges of electrode layer 60. Furthermore, capacitor insulator 64 extends into opening 61, and may partially fill opening 61.

FIG. 8A illustrates the formation of electrode layer 66. The respective process is illustrated as process 212 in the process flow 200 shown in FIG. 19. In accordance with some embodiments, electrode layer 66 is formed or comprises a conductive material selected from the same group of candidate materials of electrode layers 54 and 60. For example, electrode layer 66 may be formed of titanium nitride in accordance with some embodiments. The thickness of electrode layer 66 may be in the range between about 200 Å and about 600 Å. The formation process of electrode layer 66 may be similar to the processes shown in FIGS. 3 and 4A, which may include depositing a blanket electrode layer, forming a patterned etching mask, and etching the blanket electrode layer using the patterned etching mask to define pattern.

FIG. 8B illustrates a plane view of electrode layer 66 after the patterning process. The resulting electrode layer 66 may include capacitor electrode 66A, and metal pad 66B electrically connecting to capacitor electrode 66A. There may be, or may not be, a narrower trace portion 66C connecting capacitor electrode 66A to metal pad 66B. Alternatively, capacitor electrode 66A is connected to metal pad 66B without the trace portion. Opening 67 is formed in metal pad 66B, and is encircled by metal pad 66B. Capacitor insulator 64 is exposed to opening 67. In accordance with some embodiments, opening 67 has a circular shape. The lateral dimension D3, which may be a diameter, may be in the range between about 3.2 μm and about 5.0 μm in accordance with some embodiments. Furthermore, the lateral dimension D3 is greater than lateral dimension D1 of opening 55. The difference (D3−D1) may be greater than about 1 μm, and may be in the range between about 2.0 μm and about 3 μm in accordance with some embodiments. Furthermore, the ratio (D3−D1)/D1 may be greater than about 0.2 or greater than about 0.5, and may be in the range between about 0.5 and about 1.5. An entirety of opening 55 may be viewable (except capacitor insulator 58 may partially fill opening 55) through opening 67. It is appreciated that although electrode layer 66A is shown as having a circular plane-view shape, and metal pad 66B and opening 67 are illustrated as having circular plane-view shapes, other shapes such as circles, rectangles, hexagons, octagons, or the like, may be adopted. Capacitor electrode 66A may substantially fully overlap capacitor electrodes 60A (FIGS. 6A and 6B) and 54A. Furthermore, an entirety of capacitor electrode 66A is on capacitor insulator 64.

In accordance with some embodiments, electrode layer 66 is the top capacitor electrode of the respective capacitor. In accordance with other embodiments, the preceding processes as shown in FIGS. 6A, 6B, 7, 8A, and 8B may be repeated to form more capacitor insulator(s) and electrode layers over the capacitor insulator(s) and electrode layers formed in preceding processes. For example, an additional capacitor insulator (not shown) may be deposited on electrode layer 66 and patterned, and an additional electrode layer (not shown) may be deposited on the additional capacitor insulator and then patterned. The opening of the additional electrode layer may be directly over opening 61, and is larger than opening 61. The process of forming the capacitor insulator and the electrode layer may be repeated with an alternating pattern, with one electrode layer having its opening directly over opening 61, and the next electrode layer having its opening directly over openings 55 and 67. The openings of higher electrode layers are increasingly larger than the openings in the respective lower electrode layers.

Figure 9:
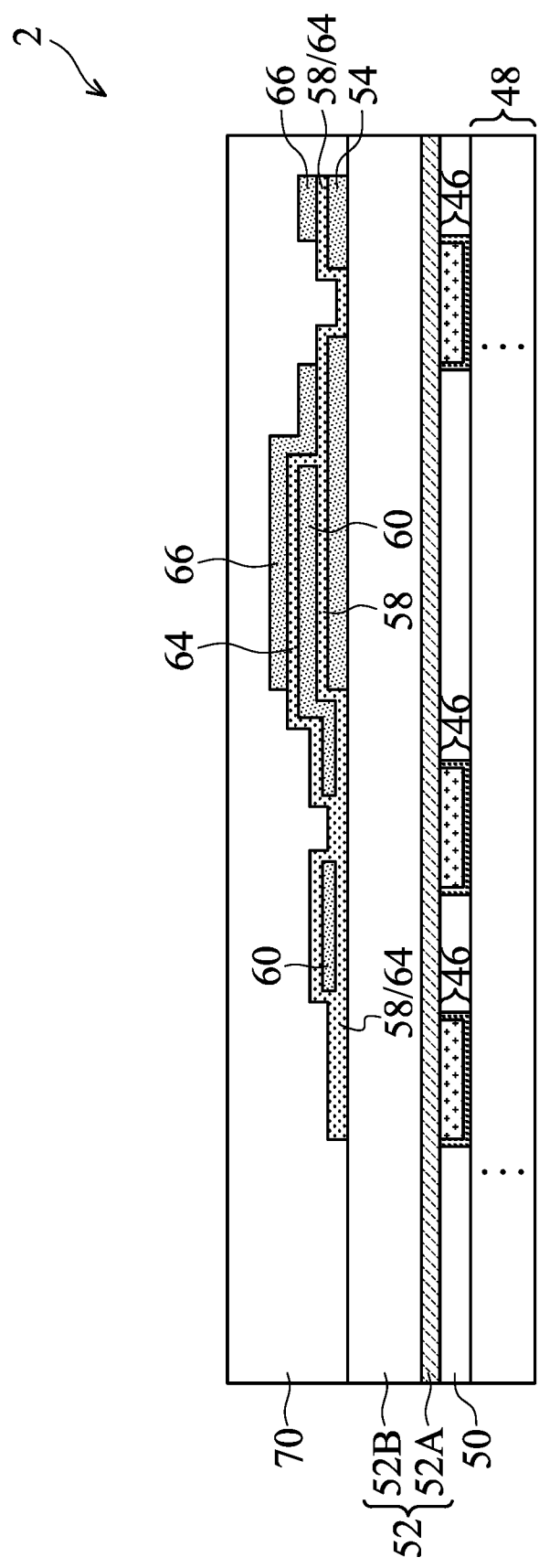

Referring to FIG. 9, dielectric layer 70 is formed. The respective process is illustrated as process 214 in the process flow 200 shown in FIG. 19. In accordance with some embodiments, dielectric layer 70 is formed of silicon oxide, USG, or the like. The thickness of dielectric layer 70 may be in the range between about 2 kÅ and about 6 kÅ. A planarization process may be performed to level the top surface of dielectric layer 70.

Figure 10:
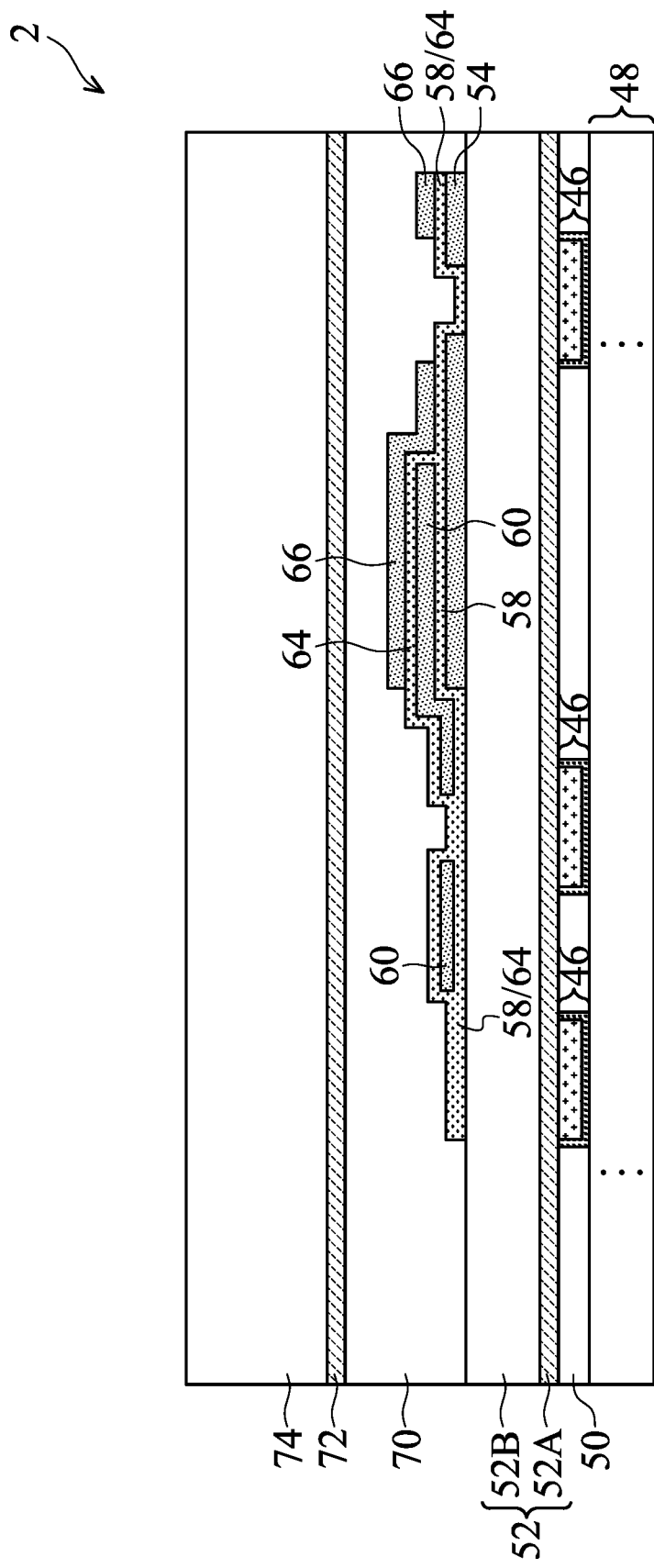

FIG. 10 illustrates the formation of etch stop layer 72 and dielectric layer 74 in accordance with some embodiments. The respective process is illustrated as process 216 in the process flow 200 shown in FIG. 19. Etch stop layer 72 may be formed of silicon nitride, silicon oxynitride, silicon carbide, or the like, and may have a thickness in the range between about 250 Å and about 750 Å. Dielectric layer 74 is formed over etch stop layer 72. Dielectric layer 74 may be formed of silicon oxide, USG, or the like. The thickness of dielectric layer 74 may be in the range between about 10 kÅ and about 50 kÅ. In accordance with some embodiments, dielectric layer 74 includes a plurality of dielectric layers such as a lower layer and an upper layer, wherein the lower layer may be formed of a high-density USG, and the upper layer may be formed of a low-density USG with a density lower than the lower layer.

In accordance with some embodiments of the present disclosure, etch stop layer 52A in FIG. 10 corresponds to etch stop layer 22 in FIG. 1, dielectric layers 52B and 70 in FIG. 10 collectively correspond to dielectric layer 24 in FIG. 1, etch stop layer 72 in FIG. 10 corresponds to etch stop layer 25 in FIG. 1, and dielectric layer 74 in FIG. 10 corresponds to dielectric layer 26 in FIG. 1.

Figure 11:
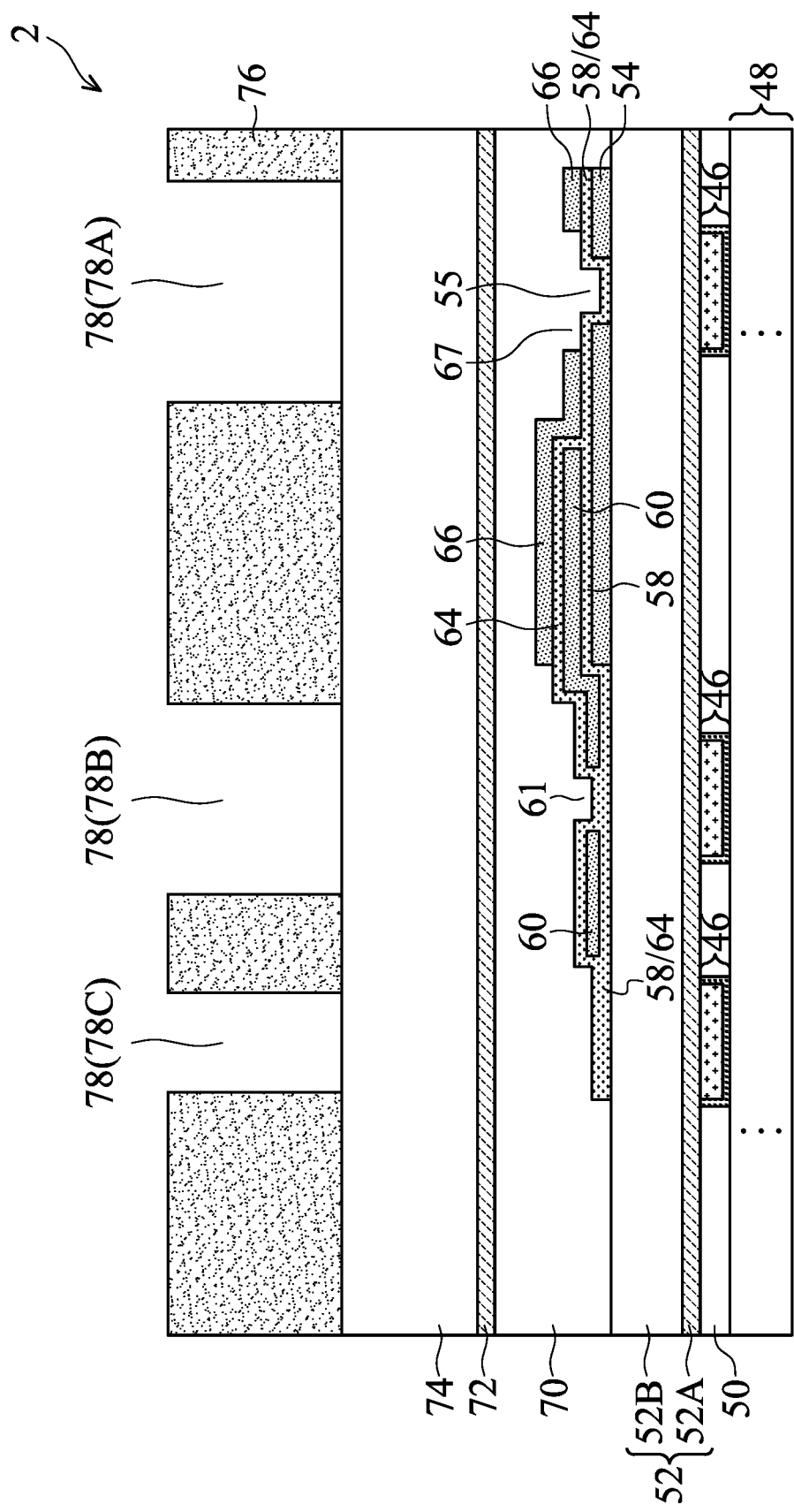

Referring to FIG. 11, etching mask 76 is formed. The respective process is illustrated as process 218 in the process flow 200 shown in FIG. 19. Etching mask 76 may include a photo resist, and may or may not include a hard mask underlying the photo resist. For example, titanium nitride, silicon nitride, or the like may be used as the hard mask. Etching mask 76 includes a plurality of openings 78, which includes openings 78A, 78B, 78C, and the like. Opening 78A overlaps openings 55 and 67, and is larger than both of openings 55 and 67. If there are more electrode layers over electrode layer 66, opening 78A is larger than the top opening in the top capacitor electrode layer, which top opening will be larger than all underlying openings in electrode layers. Furthermore, in the top view of wafer 2, opening 78A may extend laterally beyond the edges of all underneath openings (including openings 55 and 67) in all lateral directions. Similarly, opening 78B overlaps, and is larger than, opening 61. If there are more electrode layers over electrode layer 60, opening 78B is larger than the top opening in the top capacitor electrode layer, which top opening will be the largest. Furthermore, in the top view of wafer 2, opening 78B may extend laterally beyond the edges of all underneath openings (including opening 61) in all lateral directions.

Figure 12:
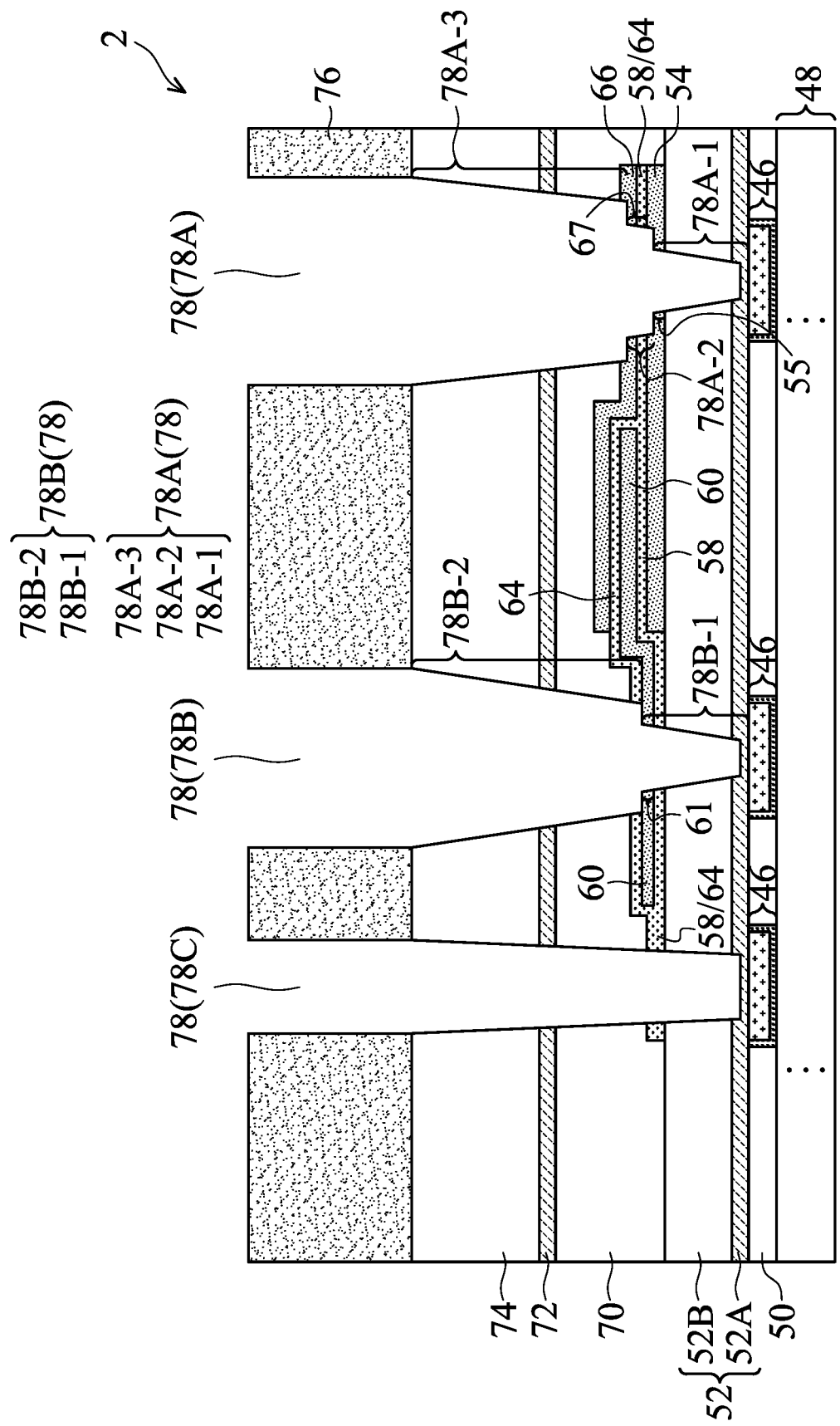

Referring to FIG. 12, a plurality of anisotropic etching processes are performed to extend openings 78 down into the underlying layers, so that contact openings are formed. The respective process is illustrated as process 220 in the process flow 200 shown in FIG. 19. The etching processes are stopped on etch stop layer 52A. After the etching, etching mask 76 is removed. During the anisotropic etching processes, a plurality of etching gases are adopted corresponding to the layers to be etched. Etch stop layer 72, when formed of silicon nitride, may be etched using a fluorine-containing gas such as the mixture of $CF_4$, $O_2$, and $N_2$, the mixture of $NF_3$ and $O_2$, $SF_6$, or the mixture of $SF_6$ and $O_2$. With the proceeding of the etching process, capacitor insulators 58 and 64 are exposed. The etching gases for etching dielectric layer 70 and capacitor insulators 58 and 64 are selected, so that the etching gases will not etch electrode layers 54, 60, and 66. Electrode layers 54, 60, and 66 are thus used as etch stop layers. This causes the lower portions of contact openings 78A and 78B to be smaller than the respective upper portions. The shapes and the sizes of the lower portions of contact openings 78A and 78B are defined by the shapes and the sizes of openings 55, 61, and 67. For example, contact opening 78A includes bottom portion 78A-1, middle portion 78A-2, and top portion 78A-3. The size and the shape of bottom portion 78A-1 are defined by the size and the shape of opening 55 in electrode layer 54. The size and the shape of middle portion 78A-2 are defined by the size and the shape of opening 67 in electrode layer 66. The size and the shape of top portion 78A-3 are defined by the size and the shape of the opening 78A in etching mask 76. Opening 78B includes bottom portion 78B-1 and top portion 78B-2. The size and the shape of bottom portion 78B-1 are defined by the size and the shape of opening 61 in electrode layer 60. The size and the shape of top portion 78B-2 are defined by the size and the shape of the opening 78B in etching mask 76.

Figure 13:
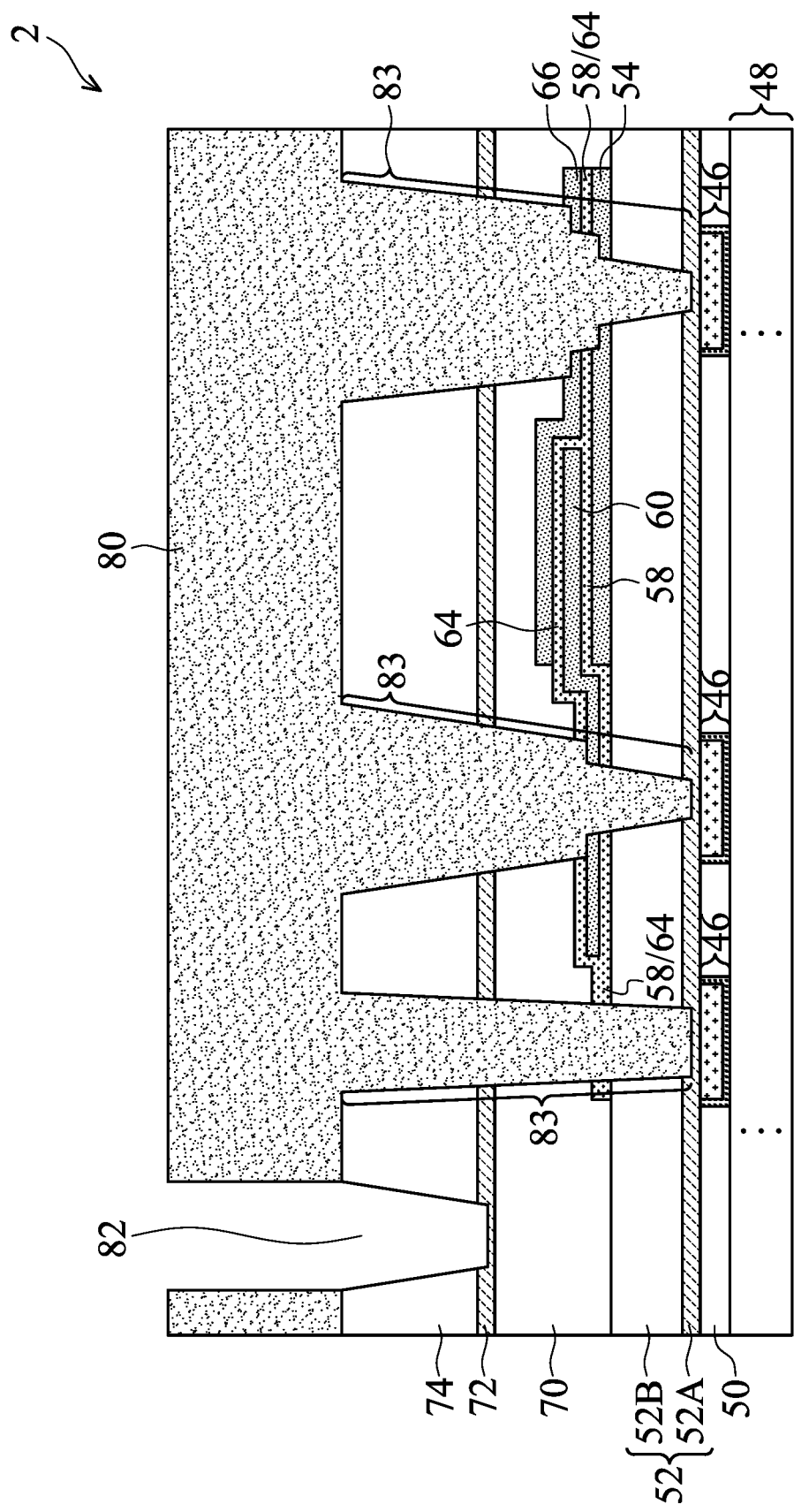

FIG. 13 illustrates the formation of an additional trench 82 in dielectric layer 74 in accordance with some embodiments. An additional etching mask 80, which may be a photo resist, is formed, and may fill openings 78 (FIG. 12). The respective process is illustrated as process 222 in the process flow 200 shown in FIG. 19. In accordance with alternative embodiments, protection plugs 83 are formed to fill openings 78 to protect the previously formed openings 78 and etch stop layer 52, and photo resist 80 is formed on protection plugs 83. The protection plugs 83 may be formed of a material different from the materials that are exposed to openings 78A and 78B as shown in FIG. 12, which exposed materials include the materials of dielectric layers 52A, 52B, 70, 72, and 74, capacitor insulators 58 and 64, and electrode layers 54, 60, and 66. Trench 82 is formed by etching dielectric 74 using etching mask 80 to define pattern. The respective process is illustrated as process 224 in the process flow 200 shown in FIG. 19. Trench 82 may be used to form a redistribution line therein.

Figure 14:
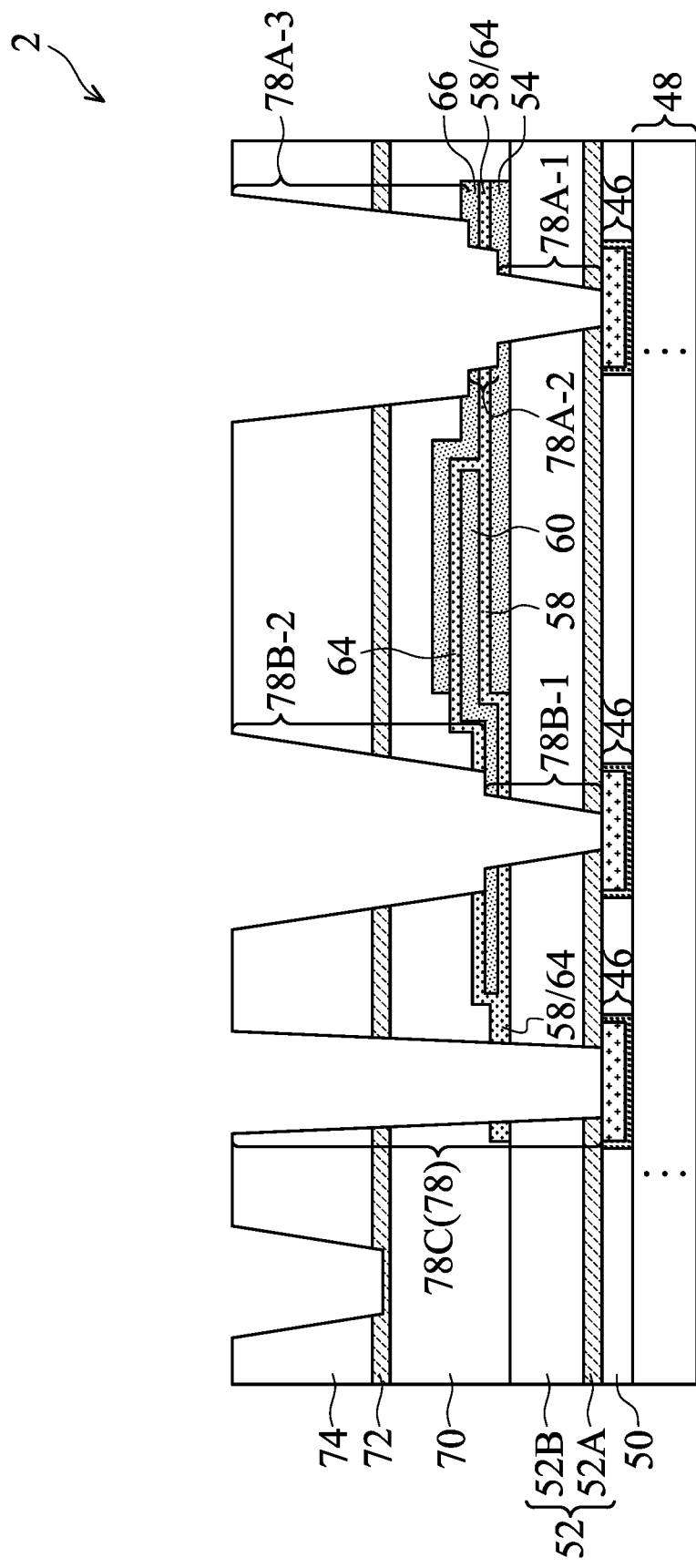
Figure 15:
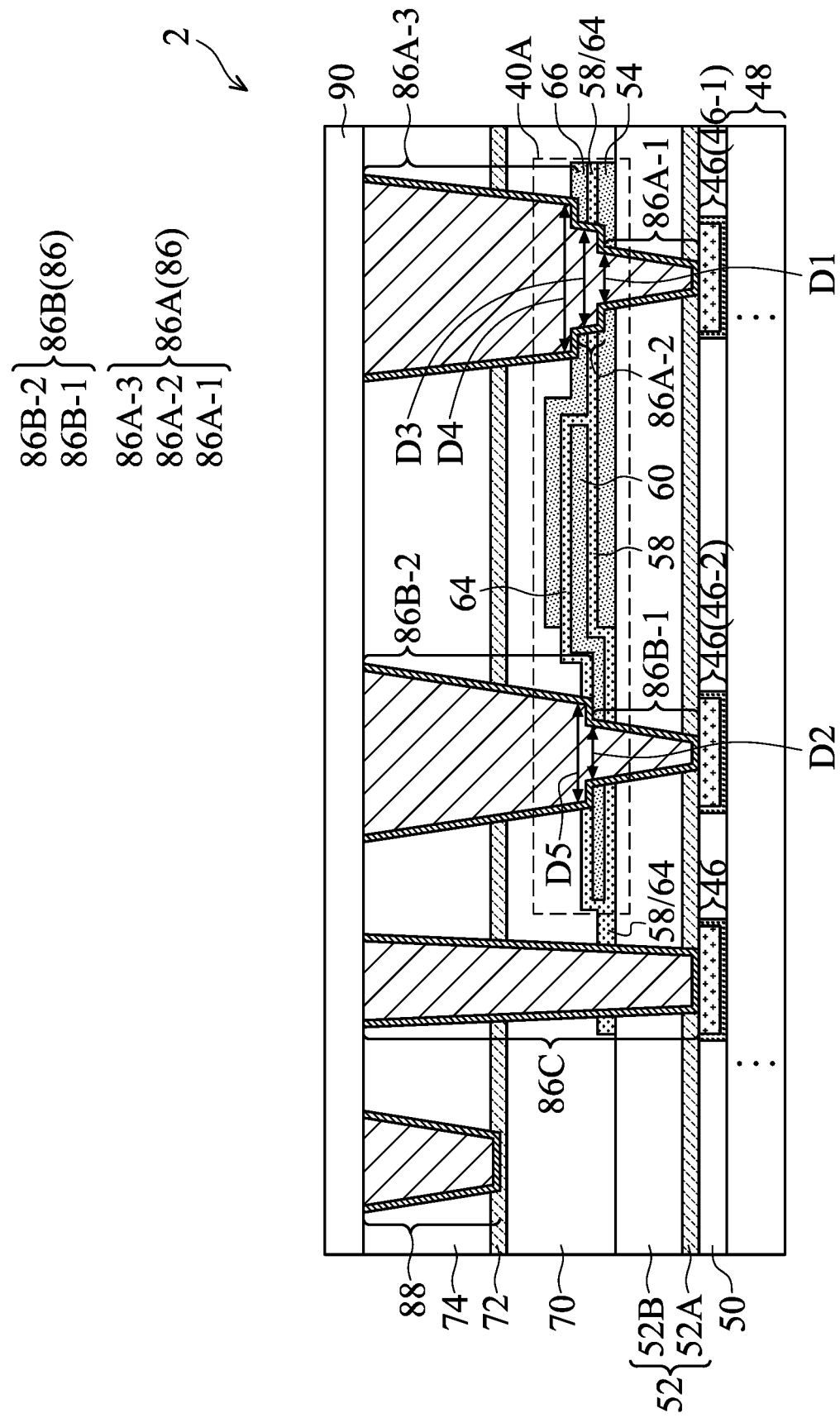

After the formation of trench 82, etching mask 80 and protection plugs 83 are removed. The respective process is illustrated as process 226 in the process flow 200 shown in FIG. 19. Next, etch stop layer 52A is etched through, so that the underlying conductive features 46 are revealed. The resulting structure is shown in FIG. 14. In a subsequent process, as shown in FIG. 15, conductive plugs 86 are formed. The respective process is illustrated as process 228 in the process flow 200 shown in FIG. 19. In accordance with some embodiments of the present disclosure, the formation of conductive plugs 86 includes depositing a conductive barrier layer, depositing a metallic material on the conductive barrier layer, and performing a planarization process such as a Chemical Mechanical Polish (CMP) process or a mechanical grinding process. The conductive barrier layer may be formed of or comprise titanium nitride, tantalum nitride, titanium, tantalum, or the like. The metallic material may include copper or a copper alloy. The resulting conductive plugs 86 have top surfaces coplanar with the top surface of dielectric layer 74. At the same time conductive plugs 86 are formed, redistribution line 88 is also formed, which may be used for routing signal, power, or the like.

Electrode layers 54, 60 and 66 and capacitor insulators 58 and 64 collectively form capacitor 40A. Conductive plugs 86A and 86B are connected to the opposing capacitor plates of capacitor 40A. Conductive plug 86A electrically connects to electrode layers 54 and 66 (which in combination act as one capacitor plate) to metal line/pad 46-1. Conductive plug 86B electrically connects electrode layer 60, which acts as another capacitor plate, to metal line/pad 46-2. Accordingly, metal line/pads 46-1 and 46-2 are connected to the opposing capacitor plates of capacitor 40A.

In accordance with some embodiments of the present disclosure, conductive plug 86A includes bottom portion 86A-1, middle portion 86A-2, and top portion 86A-3, which have increasingly greater top-view sizes and lateral diameters. For example, assuming the top-view shapes of bottom portion 86A-1, middle portion 86A-2, and top portion 86A-3 are circles with diameters D1, D3, and D4, respectively, diameter D1 may be in the range between about 1 μm and about 1.5 μm, diameter D3 may be in the range between about 3.2 μm and about 5.0 μm, and diameter D4 may be in the range between about 4 μm and about 8 μm. Conductive plug 86B includes bottom portion 86B-1 and top portion 86B-2, with the top portion 86B-2 being larger than the bottom portion 86B-1. For example, assuming the top-view shapes of bottom portion 86B-1 and top portion 86B-2 are circles with diameters D2 and D5, respectively, diameter D2 may be in the range between about 1.0 μm and about 1.5 μm, and diameter D5 may be in the range between about 1.5 μm and about 2.5 μm. It is appreciated that these values are examples, and different values are also in the scope of the present disclosure.

It is observed that by making the upper portions of conductive plugs 86 to be larger than the respective underlying portions, and allowing the bottom surfaces of the upper portions to land on the top surfaces of electrode layers, the contact areas between conductive plugs 86 and the respective electrode layers 54, 60, and 66 are increased. For example, if conductive plugs 86 have straight edges extending from top to bottom, the contact areas are determined and limited by the thicknesses of electrode layers 54, 60, and 66, which are very thin layers, and the contact resistance will be high. In accordance with some embodiments of the present disclosure, the contact areas, besides the sidewall contact areas, also include horizontal contact areas. The contact resistance values are thus reduced.

FIG. 15 also illustrates the formation of dielectric layer 90, which is also referred to as a passivation layer. The respective process is illustrated as process 230 in the process flow 200 shown in FIG. 19. In accordance with some embodiments of the present disclosure, dielectric layer 90 is formed of silicon oxide, USG, silicon nitride, or the like, or multi-layers thereof. For example, dielectric layer 90 may include an USG layer and a silicon nitride layer over the USG layer. The USG layer may have a thickness in the range between about 10 kÅ and about 20 kÅ. The silicon nitride layer may have a thickness in the range between about 5 kÅ and about 10 kÅ.

As shown in FIG. 15, the electrical connection to capacitor 40A may be made through metal lines/pads 46-1 and 46-2. In which embodiments, capacitor 40A is electrically connected to devices 12 (FIG. 1) through metal lines/pads 46-1 and 46-2. In accordance with alternative embodiments, capacitor 40A is connected to other devices through the top ends of conductive plugs 86A and 86B. In which embodiments, at a time before contact plugs 86 are formed, as shown in FIG. 11, metal lines/pads 46-1 and 46-2 may be fully insulated in dielectric materials (and hence are electrically floating).

Figure 16:
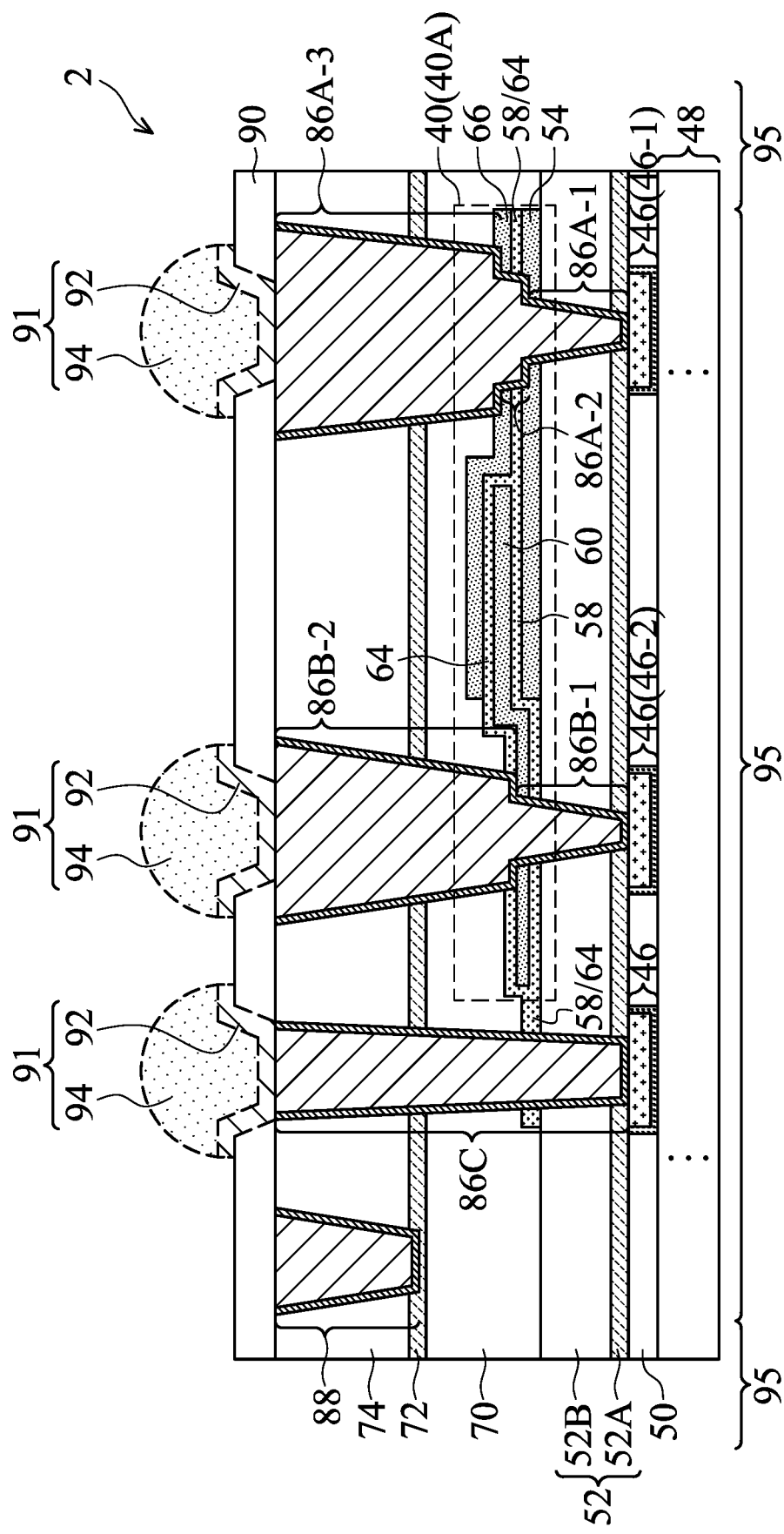

FIG. 16 illustrates the formation of electrical connectors 91, which may include Under-Bump Metallurgies (UBMs) 92 and solder regions 94. The respective process is illustrated as process 232 in the process flow 200 shown in FIG. 19. In accordance with some embodiments, electrical connectors 91 are electrically connected to capacitor 40A, so that the devices outside the respective die 95 may be connected to capacitor 40A through electrical connectors 91. In accordance with alternative embodiments when capacitor 40A is connected to devices 12 (FIG. 1), electrical connectors 91 may not be formed, and the top surfaces of conductive plugs 86 may be in contact with the bottom surface of dielectric layer 90. Accordingly, electrical connectors 91 are shown using dashed lines to indicate that they may be, or may not be, formed. Wafer 2 may then be sawed in a die-saw process to form a plurality of device dies 95, which may be identical to each other.

In accordance with some embodiments of the present disclosure, contact plugs 86 in FIG. 16 correspond to contact plugs 42 in FIG. 1, and features 90, 92, and 94 in FIG. 16 correspond to the features 30, 32, and 34, respectively, in FIG. 1.

Figure 17:
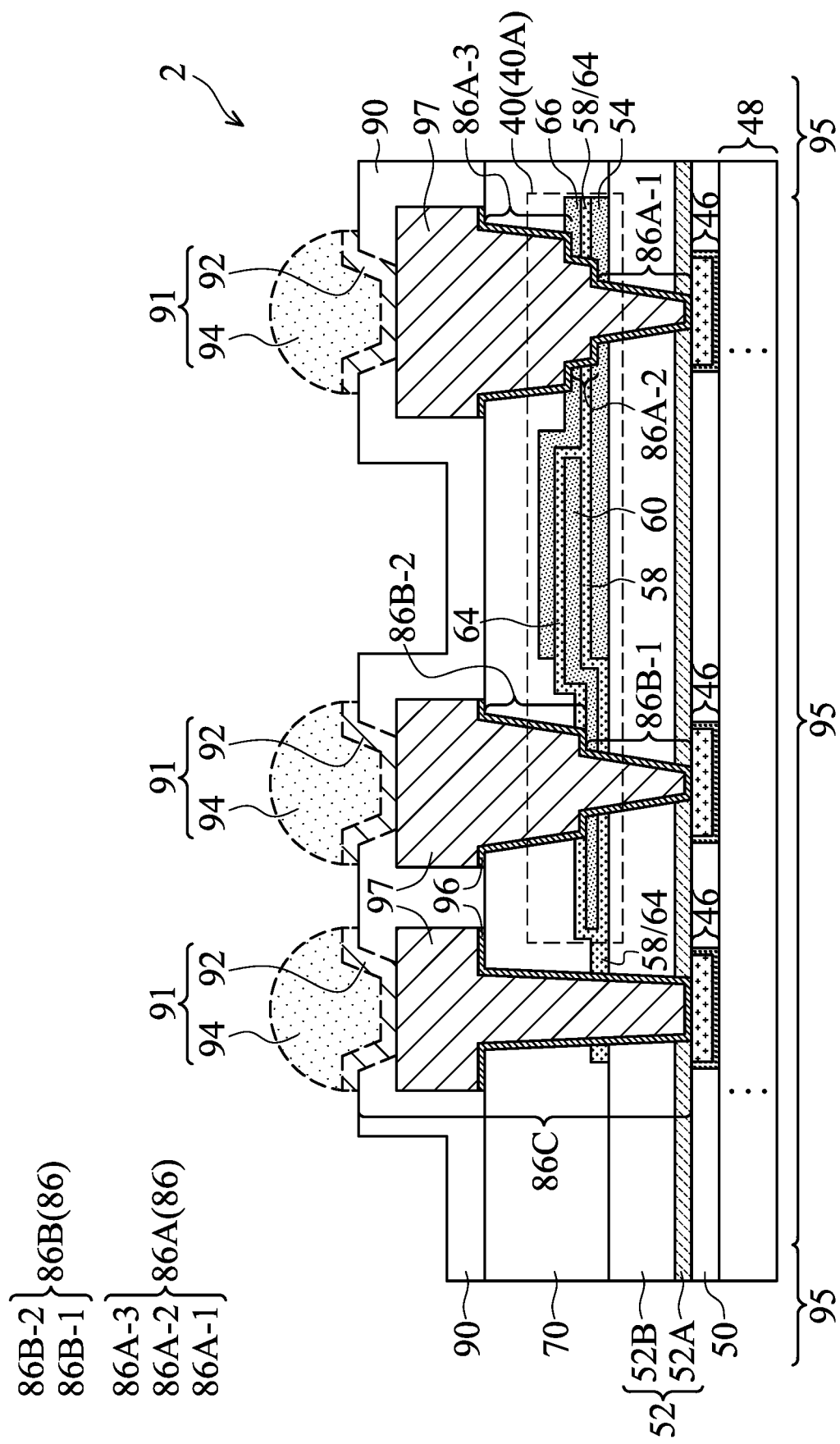
FIG. 17 illustrates a cross-sectional view of a MIM capacitor in a wafer in accordance with some embodiments.

FIG. 17 illustrates the wafer 2 and device die 95 in accordance with alternative embodiments. These embodiments are similar to the embodiments shown in FIG. 16, except that conductive plugs 86, instead of being formed in a damascene process, are formed through a deposition process followed by a patterning process. The formation process may include depositing a barrier layer 96, depositing a metal layer 97 over the barrier layer 96, and performing a patterning process through etching to form conductive plugs 86. Barrier layer 96 may be formed of titanium nitride, titanium, tantalum nitride, tantalum, or the like. Metal layer 97 may be formed of aluminum copper, nickel, aluminum, or the like, or alloys thereof. Dielectric layer 90 may then be formed. Electrical connectors 91 may be, or may not be, formed. In accordance with some embodiments of the present disclosure, dielectric layer 90 is not planarized, and hence is non-planar.

Figure 18:
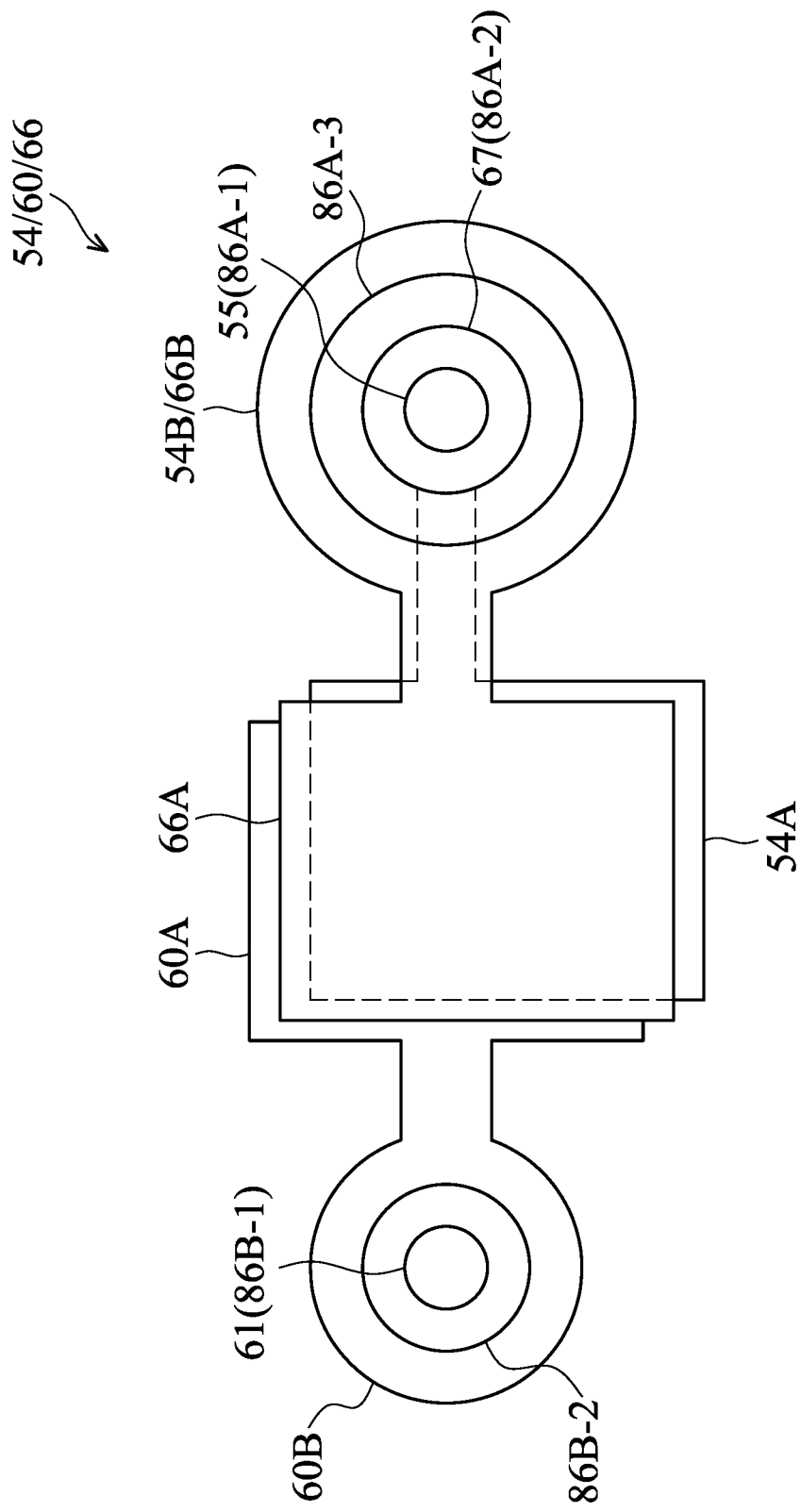
FIG. 18 illustrates a top view of various layers of a MIM capacitor in accordance with some embodiments.

FIG. 18 illustrates a top view of electrode layers 54, 60, and 66, and the openings 55, 61, and 67. It is shown that conductive plug portion 86A-3 is larger than opening 67 (into which conductive plug portion 86A-2 extends), which is further larger than opening 55 (into which conductive plug portion 86A-1 extends). Conductive plug portion 86B-2 is larger than opening 61 (into which conductive plug portion 86B-1 extends).

The embodiments of the present disclosure have some advantageous features. By forming conductive plugs having upper portions larger than the respective lower portions, the upper portions may have bottom surfaces contacting the top surfaces of electrode layers (in addition to the sidewall contact between the contact plugs and the sidewalls of electrode layers). Accordingly, the contact resistance values of the conductive plugs to the capacitor electrodes of the capacitors are reduced.

In accordance with some embodiments of the present disclosure, a method comprises forming a first electrode layer having a first opening, wherein the first opening has a first lateral dimension; forming a first capacitor insulator over the first electrode layer; forming a second electrode layer over the first capacitor insulator, wherein the second electrode layer has a second opening, with the first opening directly underlying the second opening, wherein the second opening has a second lateral dimension greater than the first lateral dimension; depositing a dielectric layer over the second electrode layer; forming a contact opening comprising a first portion comprising the first opening; and a second portion comprising the second opening; and forming a first conductive plug in the contact opening. In an embodiment, the method further comprises forming an etching mask, wherein both of the first portion and the second portion of the contact opening are formed using the etching mask. In an embodiment, the contact opening further comprises a third portion over the second portion, wherein the third portion has a third lateral dimension greater than the second lateral dimension, and the third portion of the contact opening is formed using the etching mask. In an embodiment, the first conductive plug comprises a first part in the first portion of the contact opening; and a second part in the second portion of the contact opening, wherein the second part comprises a bottom surface contacting a top surface of the first electrode layer. In an embodiment, the first conductive plug extends below the first electrode layer to contact a conductive feature. In an embodiment, the first conductive plug electrically interconnects the first electrode layer and the second electrode layer to form a first capacitor electrode of a capacitor, and the method further comprises forming a third electrode layer over the first capacitor insulator, wherein the third electrode layer acts as a second capacitor electrode of the capacitor; and forming a second capacitor insulator over the third electrode layer and underlying the second electrode layer. In an embodiment, the method further comprises forming a second conductive plug penetrating through the third electrode layer. In an embodiment, the second conductive plug has a bottom surface contacting a top surface of the third electrode layer.

In accordance with some embodiments of the present disclosure, a device comprises a first dielectric layer; a capacitor comprising a first electrode layer over the first dielectric layer; a first capacitor insulator over the first electrode layer; and a second electrode layer over the first capacitor insulator; a first conductive plug electrically interconnecting the first electrode layer and the second electrode layer, the first conductive plug comprising a first portion penetrating through the first electrode layer and extending into the first dielectric layer; and a second portion penetrating through the second electrode layer, wherein the second portion of the first conductive plug comprises a first bottom surface contacting a first top surface of the first electrode layer; and a second dielectric layer over the second electrode layer, wherein the first conductive plug extends into the second dielectric layer. In an embodiment, the first conductive plug further comprises a third portion, with the third portion extending into the second dielectric layer, and wherein the third portion comprises a second bottom surface contacting a second top surface of the second electrode layer. In an embodiment, the first portion of the first conductive plug has a first lateral dimension, and the second portion of the first conductive plug has a second lateral dimension greater than the first lateral dimension. In an embodiment, the second lateral dimension is greater than the first lateral dimension by a width difference, and a ratio of the width difference to the first lateral dimension is greater than about 0.2. In an embodiment, the second lateral dimension is greater than the first lateral dimension by a width difference greater than about 1.0 μm. In an embodiment, the capacitor further comprises a third electrode layer over the first capacitor insulator; a second capacitor insulator over the third electrode layer and underlying the second electrode layer; and a third conductive plug comprising a lower portion penetrating through the third electrode layer, and an upper portion over the third electrode layer, wherein the upper portion comprises a second bottom surface contacting a second top surface of the third electrode layer.

In accordance with some embodiments of the present disclosure, a device comprises a first conductive feature and a second conductive feature; a first dielectric layer over the first conductive feature and the second conductive feature; a capacitor comprising a first electrode layer over the first dielectric layer; a first capacitor insulator over the first electrode layer; and a second electrode layer over the first capacitor insulator; and a first conductive plug comprising a first lower portion extending from the first electrode layer to the first conductive feature; and a first upper portion over the first electrode layer, wherein a first bottom surface of the first upper portion contacts a first top surface of the first electrode layer. In an embodiment, the device further comprises a second conductive plug comprising a second lower portion extending from the second electrode layer to the second conductive feature; and a second upper portion over the second electrode layer, wherein a second bottom surface of the second upper portion contacts a second top surface of the second electrode layer. In an embodiment, the device further comprises a second capacitor insulator over the second electrode layer; and a third electrode layer over the second capacitor insulator, wherein the first conductive plug electrically interconnects the first electrode layer and the third electrode layer. In an embodiment, the first conductive plug further comprises a top portion over the first upper portion, and wherein a third bottom surface of the top portion contacts a third top surface of the third electrode layer. In an embodiment, the method further comprises a first solder region, wherein the first conductive plug electrically connects the first solder region to the first conductive feature. In an embodiment, the device further comprises a second solder region, wherein the first conductive plug electrically connects the second solder region to the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first electrode layer having a first opening, wherein the first opening has a first lateral dimension;
    forming a first capacitor insulator over the first electrode layer;
    forming a second electrode layer over the first capacitor insulator, wherein the second electrode layer has a second opening, with the first opening directly underlying the second opening, wherein the second opening has a second lateral dimension greater than the first lateral dimension;
    depositing a first dielectric layer over the second electrode layer;
    depositing a dielectric etch stop layer over the first dielectric layer;
    depositing a second dielectric layer over the dielectric etch stop layer;
    performing an etching process, with the second dielectric layer, the dielectric etch stop layer, the first dielectric layer, and the first capacitor insulator being etched to form a contact opening penetrating through the first electrode layer and the second electrode layer, wherein parts of the first electrode layer and the second electrode layer are used as conductive etch stop layers in the etching process, and wherein the contact opening comprises:
        a first portion comprising the first opening; and
        a second portion comprising the second opening; and
    forming a first conductive plug in the contact opening.

2. The method of claim 1, wherein before the etching process, the second opening is wider than the first opening, and a portion of the first electrode layer is directly underlying the second opening.

3. The method of claim 2, wherein the contact opening further comprises a third portion over the second portion, wherein the third portion has a third lateral dimension greater than the second lateral dimension.

4. The method of claim 1 further comprising:
    forming an additional opening in the second dielectric layer, wherein the additional opening stops on a top surface of the dielectric etch stop layer, and
    filling the additional opening to form an additional conductive plug, wherein the additional conductive plug and the first conductive plug are formed through a same metal deposition process.

5. The method of claim 1, wherein the first conductive plug extends below the first electrode layer to contact a conductive feature that is below the first electrode layer.

6. The method of claim 1, wherein the first conductive plug electrically interconnects the first electrode layer and the second electrode layer to form a first capacitor electrode of a capacitor, and the method further comprises:
    forming a third electrode layer over the first capacitor insulator, wherein the third electrode layer acts as a second capacitor electrode of the capacitor; and
    forming a second capacitor insulator over the third electrode layer and underlying the second electrode layer.

7. The method of claim 6 further comprising forming a second conductive plug penetrating through the third electrode layer.

8. The method of claim 7, wherein the second conductive plug has a bottom surface contacting a top surface of the third electrode layer.

9. A method comprising:
    depositing a first dielectric layer over a base structure;
    forming a capacitor over the first dielectric layer comprising:
        depositing a first electrode layer over the first dielectric layer;
        patterning the first electrode layer to form a first opening;
        forming a first capacitor insulator over the first electrode layer;
        depositing a second electrode layer over the first capacitor insulator; and
        patterning the second electrode layer to form a second opening, wherein a portion of first electrode layer is directly under the second opening;
    depositing a second dielectric layer over the second electrode layer;
    depositing an etch stop layer over the second dielectric layer;
    depositing a third dielectric layer over the etch stop layer;
    forming an etching mask over the third dielectric layer;
    etching the third dielectric layer, the etch stop layer, the second dielectric layer, and the first capacitor insulator to form a contact opening, wherein the etching mask is used in the etching of the third dielectric layer, the etch stop layer, the second dielectric layer, and the first capacitor insulator, with both of the first opening and the second opening being parts of the contact opening, wherein in the etching, a first part of the second electrode layer acts as a first etch stop layer; and
    forming a contact plug in the contact opening, wherein the contact plug contacting both of the first electrode layer and the second electrode layer.

10. The method of claim 9, wherein at a time after the second dielectric layer is deposited and before the etching is performed, the portion of the first electrode layer that is directly under the second opening has a ring shape.

11. The method of claim 10, wherein in the etching, a second part of the first electrode layer acts as a second etch stop layer.

12. The method of claim 11, wherein a top surface of an additional etch stop layer underlying the first electrode layer is exposed to the contact opening, and the method further comprises, after the etching, etching-through the additional etch stop layer to expose an underlying conductive feature.

13. The method of claim 9 further comprising:
depositing a third electrode layer over the first capacitor insulator;
forming a second capacitor insulator over the third electrode layer, wherein the second electrode layer is over the second capacitor insulator; and
patterning the third electrode layer to form a third opening vertically offset from both of the first opening and the second opening.

14. The method of claim 9, wherein the depositing the first electrode layer and the depositing the second electrode layer comprise depositing titanium nitride layers.

15. A method comprising:
forming a plurality of conductive layers over a base structure, the plurality of conductive layers comprising openings therein, wherein upper openings in upper ones of the plurality of conductive layers are increasingly larger than lower openings in respective lower ones of the plurality of conductive layers;
forming a plurality of dielectric layers, wherein the plurality of conductive layers and the plurality of dielectric layers are alternatingly allocated;
etching the plurality of dielectric layers to form a contact opening, wherein the plurality of conductive layers acts as conductive etch stop layers during the etching, and the contact opening comprises the openings in the plurality of conductive layers; and
forming a contact plug to fill the contact opening, wherein the contact plug contacts a top surface and a sidewall of each of the plurality of conductive layers.

16. The method of claim 15, wherein before the plurality of dielectric layers are etched, an upper opening in an upper layer of the plurality of conductive layers is wider than a lower opening in a lower layer of the plurality of conductive layers.

17. The method of claim 15, wherein the contact plug comprises a sidewall, and the sidewall of the contact plug comprises a plurality of steps.

18. The method of claim 15 further comprising:
depositing a first dielectric layer over the plurality of conductive layers and the plurality of dielectric layers;
depositing a dielectric etch stop layer over the first dielectric layer;
depositing a second dielectric layer over the dielectric etch stop layer; and
etching the second dielectric layer, the dielectric etch stop layer, and the first dielectric layer, wherein the second dielectric layer, the dielectric etch stop layer, and the first dielectric layer are etched using a same etching mask as the etching the plurality of dielectric layers.

* * * * *